United States Patent
Wang et al.

(10) Patent No.: US 12,419,007 B2
(45) Date of Patent: Sep. 16, 2025

(54) POWER SYSTEM BASED FAN CONTROL METHOD

(71) Applicant: Lenovo (Singapore) Pte. Ltd., Singapore (SG)

(72) Inventors: Hao-Yu Wang, Kanagawa (JP); Atsunobu Nakamura, Kanagawa (JP); Qianyi Lu, Kanagawa (JP); Akinori Uchino, Kanagawa (JP)

(73) Assignee: Lenovo (Singapore) Pte. Ltd., Singapore (SG)

( * ) Notice: Subject to any disclaimer, the term of this patent is extended or adjusted under 35 U.S.C. 154(b) by 551 days.

(21) Appl. No.: 17/882,067

(22) Filed: Aug. 5, 2022

(65) Prior Publication Data
US 2024/0049422 A1   Feb. 8, 2024

(51) Int. Cl.
 H05K 7/20      (2006.01)
 G06F 1/20      (2006.01)

(52) U.S. Cl.
 CPC ......... *H05K 7/20209* (2013.01); *G06F 1/206* (2013.01); *H05K 7/20136* (2013.01); *G06F 1/203* (2013.01)

(58) Field of Classification Search
 CPC . H05K 7/20209; H05K 7/20136; G06F 1/206
 USPC ....................................................... 700/300
 See application file for complete search history.

(56) References Cited

U.S. PATENT DOCUMENTS

| | | | | |
|---|---|---|---|---|
| 2009/0155045 A1* | 6/2009 | Chang | ............. | F01P 7/04 415/17 |
| 2009/0167228 A1* | 7/2009 | Chung | ............. | G06F 1/206 318/473 |
| 2013/0073096 A1* | 3/2013 | Brey | ............. | G05B 13/02 700/282 |
| 2014/0117908 A1* | 5/2014 | Busch | ............. | H02P 1/04 318/471 |
| 2018/0059747 A1* | 3/2018 | Pfeifer | ............. | G06F 1/3206 |

* cited by examiner

*Primary Examiner* — Jigneshkumar C Patel
(74) *Attorney, Agent, or Firm* — Osha Bergman Watanabe & Burton LLP

(57) ABSTRACT

A method of operating a fan of a computing system includes: measuring a temperature of a subcomponent of the computing system; and comparing the temperature to a temperature threshold. When the temperature is greater or equal to than the temperature threshold, the fan is controlled based on a predetermined table of fan level settings. When the temperature less than the temperature threshold, a fan speed of the fan is measured. When the fan speed is not equal to zero, the method returns to the measurement of the temperature. When the fan speed is equal to zero, the fan is controlled based on a first power determination. The first power determination includes: measuring a system power level; and comparing the system power level to a trigger threshold. When the system power level is greater than the trigger threshold, the fan is activated to a predetermined setting.

8 Claims, 11 Drawing Sheets

POWER SYSTEM BASED FAN CONTROL METHOD

TECHNICAL FIELD

The present disclosure relates to a control method of a fan in a computing system.

BACKGROUND

Computing systems operate at various power levels and the operational characteristics (e.g., power requirements, heat production, noise production, vibration production) of subcomponents of the computing system may vary based on an applied computational load. For example, a processor (e.g., a central processing unit (CPU), a graphical processing unit (GPU)) may emit a narrowband noise centered at 5 kHz when place under heavy workloads. Due to the physiological characteristics of human hearing, the emitted 5 kHz narrowband noise may be extremely noticeable to a user even when the amplitude of the noise is relatively low. Specifically, a "sharpness" parameter, that quantifies a relative contribution of low frequency noise components and high frequency noise components in the range of human hearing, may increase to the point that the 5 kHz noise from the computing system would be considered an annoyance that degrades of the user's experience of operating the computing system.

SUMMARY

In general, one or more embodiments of the invention relate to a method of operating a fan of computing system. The method includes: measuring a temperature of a subcomponent of the computing system; comparing the temperature to a temperature threshold; when the temperature is greater than or equal to the temperature threshold, controlling the fan based on a predetermined table of fan level settings; when the temperature less than the temperature threshold, measuring a fan speed of the fan; when the fan speed is not equal to zero, returning to the measurement of the temperature; and when the fan speed is equal to zero, controlling the fan based on a first power determination. The first power determination includes: measuring a system power level; comparing the system power level to a trigger threshold; when the system power level is greater than the trigger threshold, activating the fan to a predetermined setting; and when the system power level is less than or equal to the trigger threshold, controlling the fan based on a second power determination.

In general, one or more embodiments of the invention relate to a non-transitory computer readable medium (CRM) storing computer readable program code for operating a fan of computing system. The computer readable program code causes a computer system to: measure a temperature of a subcomponent of the computing system; compare the temperature to a temperature threshold; when the temperature is greater than or equal to the temperature threshold, control the fan based on a predetermined table of fan level settings; when the temperature less than the temperature threshold, measure a fan speed of the fan; when the fan speed is not equal to zero, return to the measurement of the temperature; and when the fan speed is equal to zero, control the fan based on a first power determination. The first power determination includes causing the computer system to: measure a system power level; compare the system power level to a trigger threshold; when the system power level is greater than the trigger threshold, activate the fan to a predetermined setting; and when the system power level is less than or equal to the trigger threshold, control the fan based on a second power determination.

In general, one or more embodiments of the invention relate to a computer system comprising: a power supply; a processor coupled to the power supply; and a fan. The processor is configured to: measure a temperature of a subcomponent of the computing system; compare the temperature to a temperature threshold; when the temperature is greater than or equal to the temperature threshold, control the fan based on a predetermined table of fan level settings; when the temperature less than the temperature threshold, measure a fan speed of the fan; when the fan speed is not equal to zero, return to the measurement of the temperature; and when the fan speed is equal to zero, control the fan based on a first power determination. For the first power determination, the processor is configured to: measure a system power level based on the power supply; compare the system power level to a trigger threshold; when the system power level is greater than the trigger threshold, activate the fan to a predetermined setting; and when the system power level is less than or equal to the trigger threshold, control the fan based on a second power determination.

Other aspects of the invention will be apparent from the following description and the appended claims.

DETAILED DESCRIPTION

Figure 1:
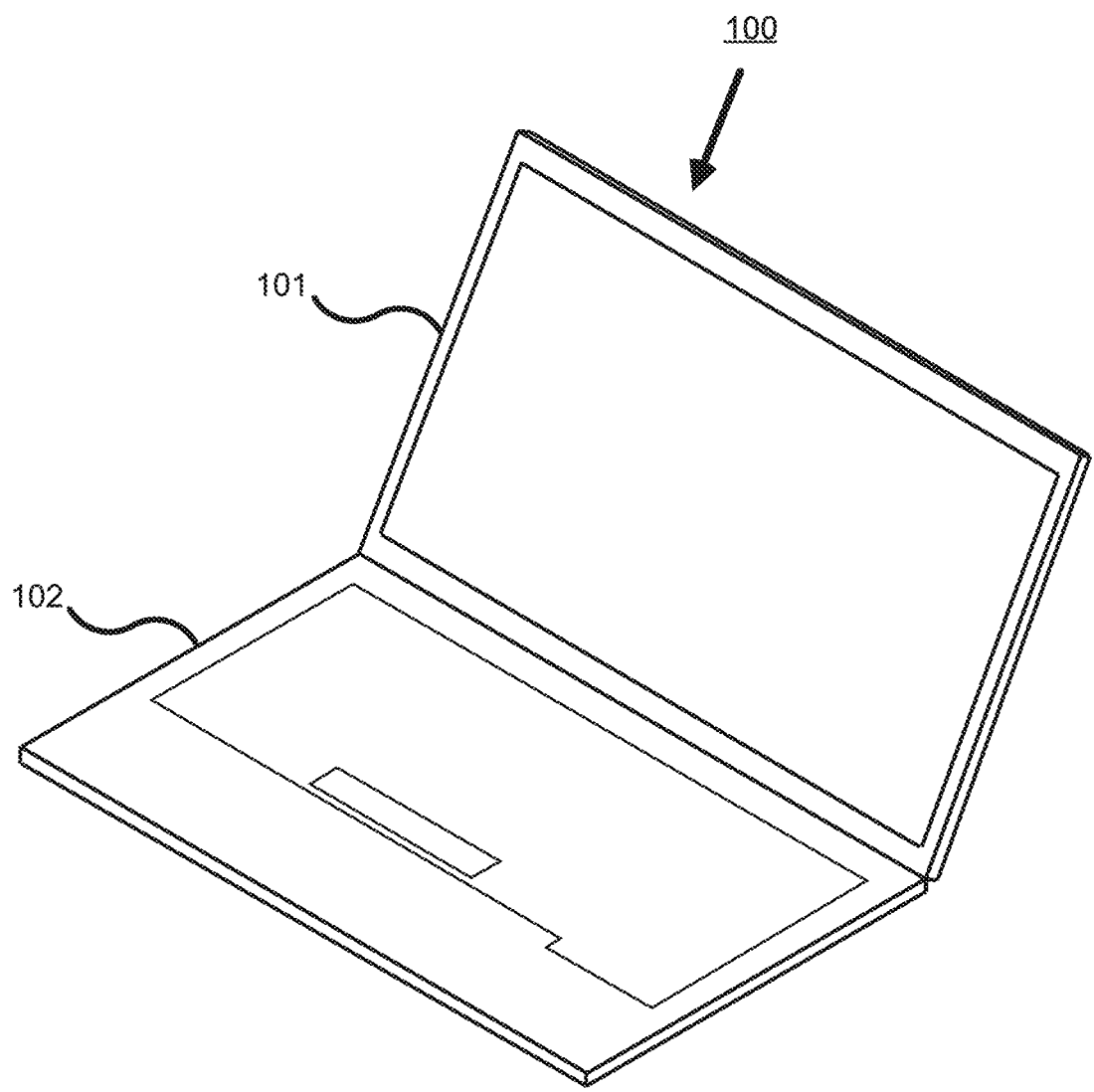
FIG. 1 shows a perspective view of a computing system in accordance with one or more embodiments of the invention.

Specific embodiments of the invention will now be described in detail with reference to the accompanying figures. Like elements in the various figures are denoted by like reference numerals for consistency.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

In general, embodiments of the invention provide a method of eliminating a sharpness noise from a computing system operating under a heavy workload. More specifically, embodiments of the invention are directed to method of controlling a fan of the computing system based on a system power level such that a fan noise lowers the overall sharpness of sound emitted by the computing system. A computing system may include one or more fans that may be controlled to manage sharpness noise from one or more system subcomponents that may produce undesired noise under predetermined operation conditions.

FIG. 1 shows a perspective view of a computing system 100 in accordance with one or more embodiments of the invention. The computing system 100 may be a personal computer (PC) (e.g., laptop PC, tablet PC, desktop PC, convertible PC) that includes a display portion 101 and a chassis portion 102. The display portion 101 may include a display subcomponent (e.g., a liquid crystal display (LCD)) and one or more subcomponents (e.g., user-facing camera/ lights, indicator lights). The chassis portion 102 may include a keyboard, a touchpad, a hinge mechanism that connects to the display portion 101, and a variety of internal subcomponents, as described in detail below with respect to FIG. 2. In one or more embodiments, the computing system 100 may exclude a display portion 101 and only include subcomponents in a chassis portion 102 or vice versa exclude a chassis portion 102 and only include subcomponents in a display portion 101. The computing system 100 may be a smart device, a server, a phone, a display, or any other computing device with a subcomponent that may produce a sharpness noise.

Figure 2:
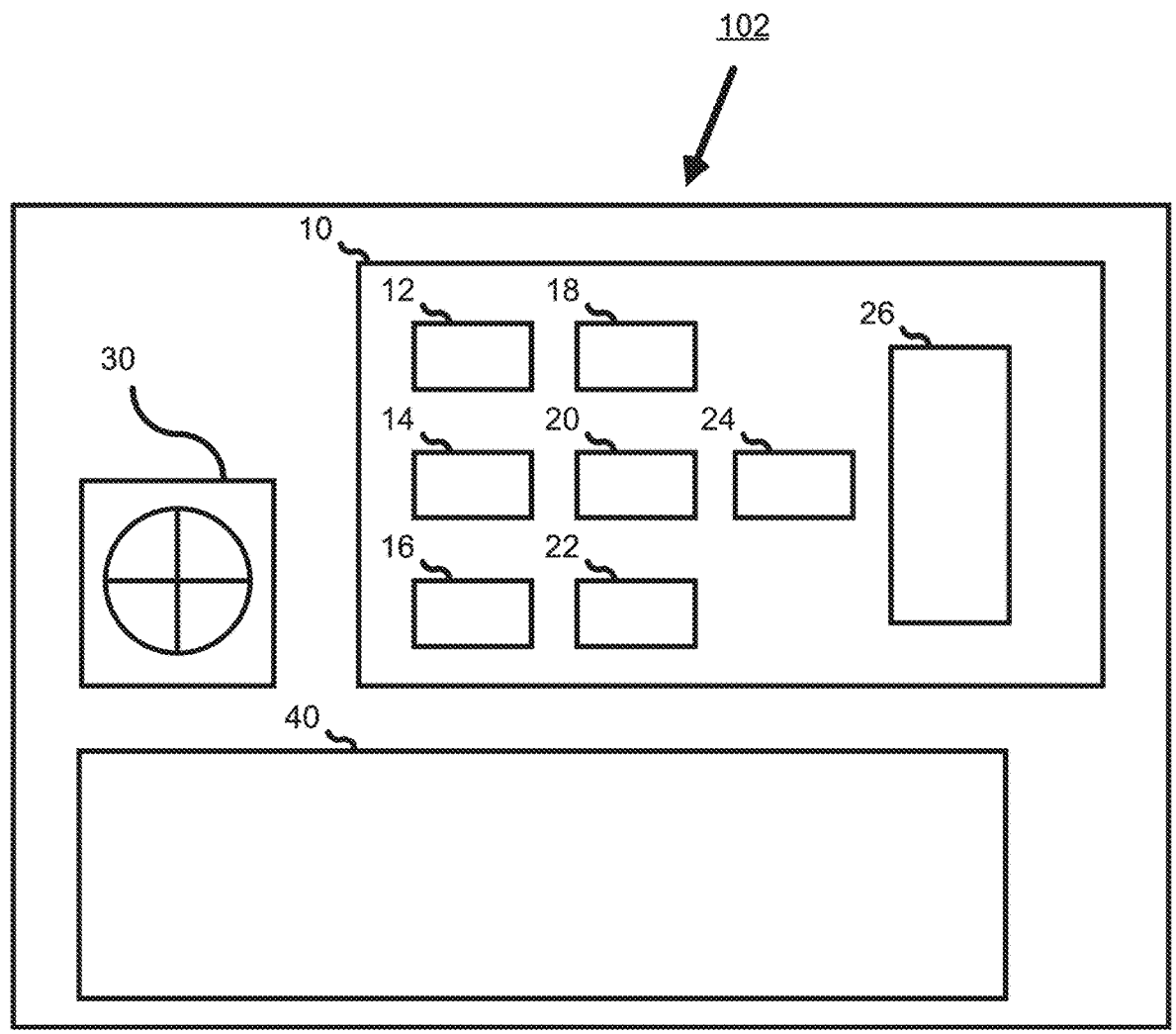
FIG. 2 shows a schematic of various subcomponents included in the computing system of FIG. 1 in accordance with one or more embodiments of the invention.

FIG. 2 shows a schematic of various subcomponents included in the computing system 100 of FIG. 1 in accordance with one or more embodiments of the invention. The chassis portion 102 of the computing system 100 may include a motherboard 10 with a plurality of subcomponents. The subcomponents installed on the motherboard 10 may include a central processing unit (CPU) 12, a memory 14, a graphic processing unit (GPU) 16 (e.g., a video subsystem), a chipset 18, a Basic Input Output System (BIOS) memory 20, an embedded controller 22, a power control circuit 24, and a storage device 26 (e.g., hard disk drive (HDD), a solid state drive (SSD)). The chassis portion 102 may further include a fan 30 and a battery 40. In one or more embodiments, the above subcomponents of the computing system 100 may be omitted, included in multiple quantities, combined as a single subcomponent (e.g., a processor that acts as a controller of one or more subcomponents), and/or disposed in other portions of the computing system 100. Further, it will be appreciated that other subcomponents (e.g., USB devices, peripheral elements, removeable components, external power supplies) beyond those listed above may be included, internally or externally, as a subcomponent of the computing system 100 without departing from the scope of the present disclosure.

Figure 3:
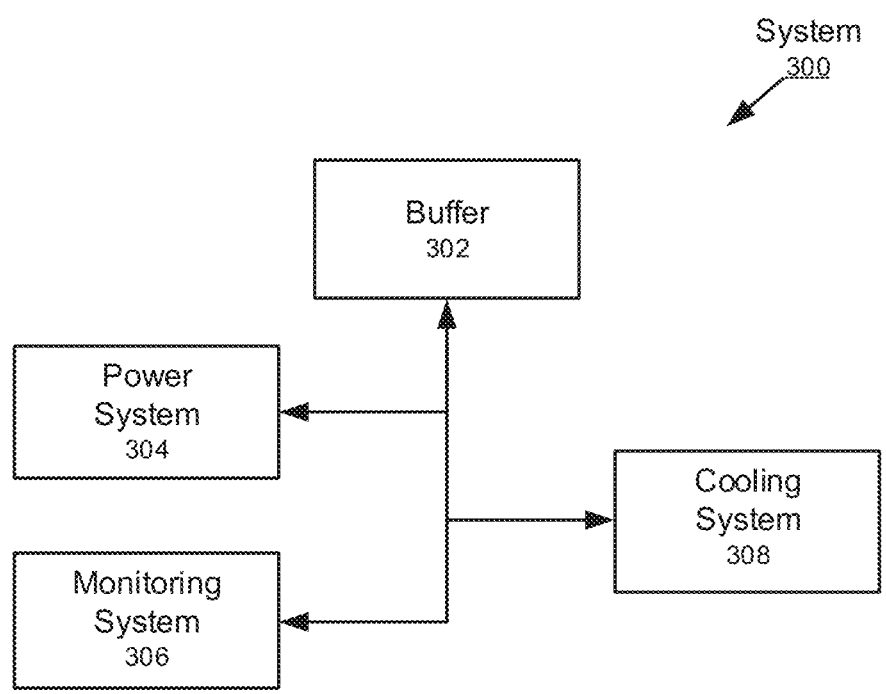
FIG. 3 shows a functional schematic of the computing system of FIG. 1 in accordance with one or more embodiments of the invention.

FIG. 3 shows a functional schematic of the computing system of FIG. 1 in accordance with one or more embodiments of the invention. The functional system 300 has multiple functional components, including, for example, a buffer 302, a power system 304, a monitoring system 306, and a cooling system 308. Each of these functional components 302, 304, 306, 308 (i.e., subsystems) may be constituted by one or more physical subcomponents described above with respect to FIG. 2. Each of these functional components is discussed below.

The functional system 300 includes the buffer 302. The buffer 102 may be implemented in hardware (e.g., memory 14, storage device 26), software, or any combination thereof. The buffer 102 is configured to store information (e.g., threshold values, thermal tables, counter valves and thresholds, measurement data/history). The stored information may be generated, edited, and/or deleted by the power system 304, the monitoring system 306, the cooling system 308, or any combination thereof.

The functional system 300 further includes the power system 304. The power system 304 may be implemented in hardware (e.g., battery 40, power control circuit 24, an external power supply), software, or any combination thereof. The power system 304 is configured to supply power to the computing system 100 and the various subcomponents. The power system 304 controls a system power level of the computing system 100 to satisfy the operational requirements of any computational load applied to the computing system 100. Based on the operational capabilities of the computing system 100 and/or the applied computational load, the power system 304 may generate, edit, and/or delete any appropriate information (e.g., power threshold values, system power level measurements/history) in the buffer 302. Furthermore, based on the system power level, the power system 304 may provide instructions to one or more other subsystems to change behavior.

The functional system 300 further includes the monitoring system 306. The monitoring system 306 may be implemented in hardware (e.g., one or more sensors, embedded controllers, microphones, processors), software, or any combination thereof. The monitoring system 306 is configured to measure and monitor the system power level of the computing system 100. The monitoring system 306 is further configured to measure and monitor the temperature of one or more subcomponents of the computing system 100. Furthermore, the monitoring system 306 may be configured to obtain a fan speed or fan setting by measuring and monitoring a fan. The monitoring system 306 may obtain the measurements from sensors attached to the appropriate subcomponents of the computing system 100 or may obtain the information directly from the appropriate subsystems of the function system 300. Based on the measured system power level, temperature levels, and/or fan information, the monitoring system 306 may generate, edit, and/or delete any appropriate information (e.g., power threshold values, temperature threshold values, measurement values/history) in the buffer 302. Furthermore, based on the information acquired, the monitoring system 306 may provide instructions to the power system 304 and/or cooling system 308 to change behavior, as discussed in further detail below with respect to FIGS. 8-10.

The functional system 300 further includes the cooling system 308. The cooling system 308 may be implemented in hardware (e.g., fan 30), software, or any combination thereof. The cooling system 308 is configured to cool the computing system 100. For example, the cooling system 308 may control the speed or power setting of one or more exhaust fans that force air through the computing system 100 to dissipate heat generated by subcomponents of the computing system 100. The fan 30 may be one or more fans (e.g., radial fan, axial fan) operated at variable settings to control the volume and the pressure of the air flowing through the fan 30. The cooling system 308 may include any type of suitable forced air system and is not limited to the examples above. Based on the fan speed or settings (e.g., a FanLevel), the cooling system 308 may generate, edit, and/or delete any appropriate information (e.g., fan settings/history, temperature control table, thermal table) in the buffer 302.

Although the functional system 300 is shown as having four subsystems 302, 304, 306, and 308, in other embodiments of the invention, the functional system 300 may have more or fewer subsystems. Further, the functionality of each subsystems described above may be split across subsystems or combined into a single subsystem. Further still, each subsystems 302, 304, 306, and 308 may be utilized multiple times in a single computing system 100 to address a sharpness noise generated by one or more subcomponents of a computing system 100.

Figure 4A:
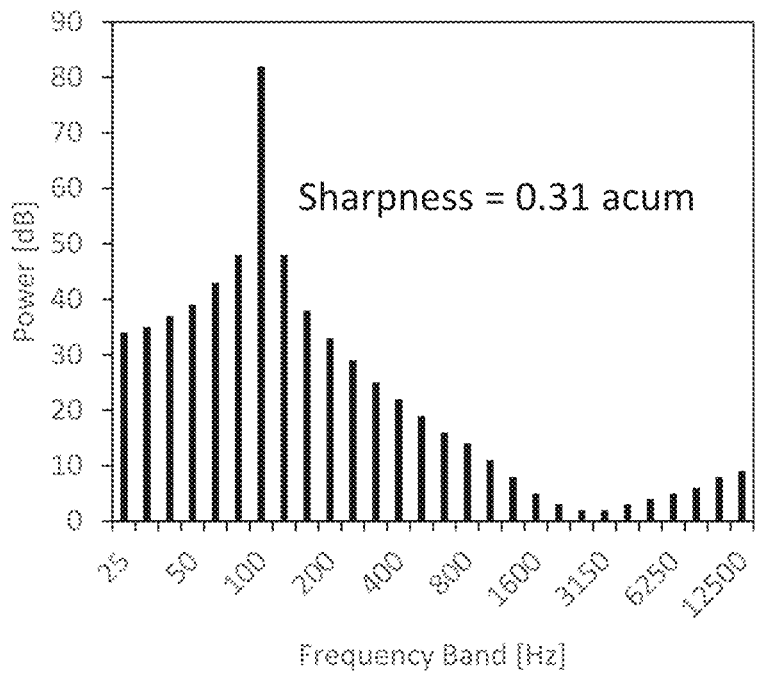
FIG. 4A shows a spectrograph of a sound with a relatively low sharpness.
Figure 4B:
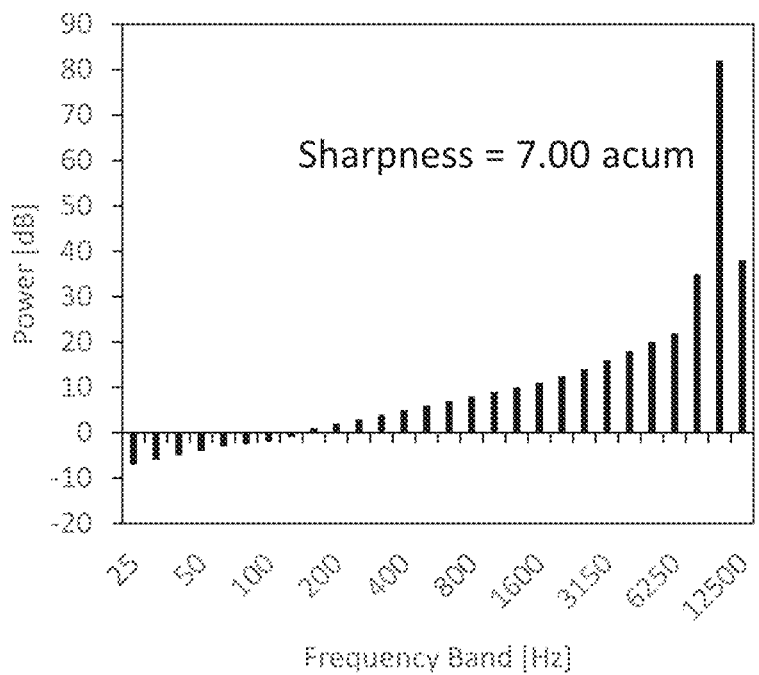
FIG. 4B shows a spectrograph of a sound with a relatively high sharpness.

FIGS. 4A and 4B respectively show spectrographs of sounds with a relatively low sharpness and relatively high sharpness, quantified in units of "acum." Specifically, FIG. 4A shows the frequency spectrum of a 100 Hz tone with a sharpness value of 0.31 acum and FIG. 4B shows the frequency spectrum of a 10 kHz tone with a sharpness value of 7.00 acum. While the peak intensity of the target frequency of each tone is approximately equal (about 82 dB), the relative distribution of low frequencies and high frequencies across the range of human perception (i.e., approximately between 20 Hz and 20 kHz) results in different perceived sharpness by the human ear.

Figure 5A:
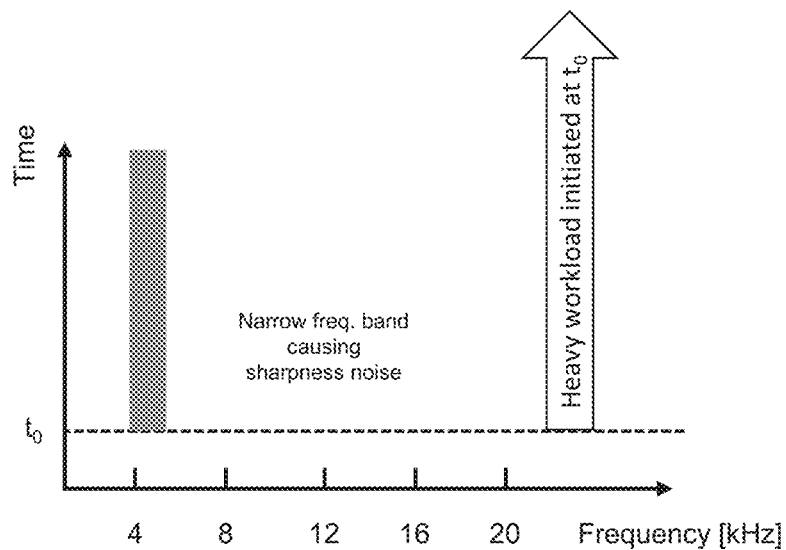
FIG. 5A shows a conceptual time-varying spectrograph of a system producing a sharpness noise under heavy workload.

FIG. 5A shows a conceptual time-varying spectrograph of a system producing a sharpness noise under heavy workload. As discussed above, the operational characteristics of a subcomponent in the computing system 100 may change over time based on workload load applied to the computing system 100. For example, under a heavy workload initiated at a time $t_0$, a CPU 12 may begin to emit a narrowband noise centered near 5 kHz as shown by the frequency band (the dark band) spanning 4 kHz to 6 kHz starting at time $t_0$ and extending vertically as time progresses onward from time $t_0$. Because the high narrowband noise is the strongest component of the frequency spectrum at any given point after time $t_0$, a sharpness noise is perceived by a user of the computing system 100 starting time $t_0$.

In one or more embodiments, a subcomponent other than the CPU 12 may generate the narrowband noise. Furthermore, the central frequency may be any value that falls within the audible range of human perception, and the width of the narrowband may be a value other than 2 kHz.

Figure 5B:
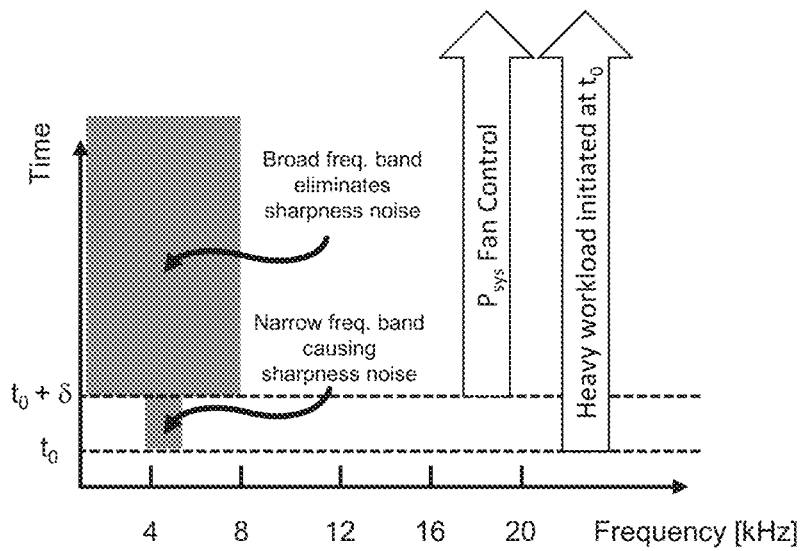
FIG. 5B shows a conceptual time-varying spectrograph of a system eliminating a sharpness noise under heavy workload in accordance with one or more embodiments of the invention.

FIG. 5B shows a conceptual time-varying spectrograph of a system eliminating a sharpness noise under heavy workload in accordance with one or more embodiments of the invention. To reduce the sharpness noise shown in FIG. 5A, the computing system 100 according to one or more embodiments may introduce additional noise contributions within the audible range of human perception to contribute more frequency components across the spectrum. As shown in FIG. 5B, a fan 30 may be started at time $t_0+\delta$ to add a broadband noise contribution that overlaps the narrowband noise generated by the CPU 12. For example, the rotating motion of the fan 30, the air flow through the fan 30, or the air flowing through an air passageway connected to the fan 30 (e.g., exhaust duct, internal passages in the chassis 102) may generate a broadband noise centered near 4 kHz as shown by the frequency band spanning 0 kHz to 8 kHz starting at time $t_0+\delta$ and extending vertically as time progresses onward from time $t_0+\delta$.

Because the narrowband noise is complemented by frequency contributions above and below the 5 kHz central frequency, the overall frequency spectrum has a broader bandwidth after time $t_0+\delta$. The change in the relative distribution of frequency components results in a sound with a quantitatively lower sharpness value and may improve the user experience of the computing system 100 compared to the time period between $t_0$ and $t_0+\delta$. By reducing the time delay S between the start of the narrowband noise and the introduction of the broadband noise, the period of potential user discomfort between time $t_0$ and time $t_0+\delta$ may be reduced or eliminated (i.e., eliminating or reducing the sharpness noise).

In one or more embodiments, a fan 30 may generate the broadband noise with a central frequency that may be any value that falls within the audible range of human perception. Further, the width of the broadband noise may be a value other than 8 kHz. For example, the broadband noise is not required to overlap or be adjacent to the narrowband noise to decrease the sharpness of the overall sound.

In one or more embodiments, the fan 30 is controlled based on a system power level of the computing system 100, which is elevated when a heavy workload is applied to the CPU 12. As discussed in further detail below with respect to FIGS. 6A and 6B, basing the fan control method on the system power level may provide faster activation of the fan compared to a conventional control scheme (e.g., fan activation/speed control/deactivation based only temperature measurements).

Figure 6A:
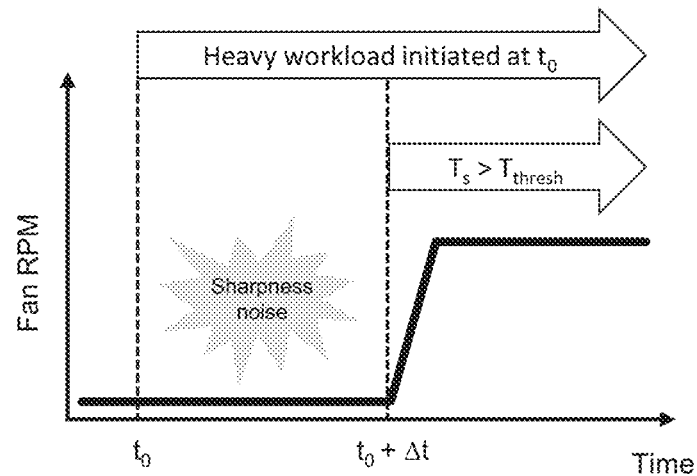
FIG. 6A shows a fan control method based on a thermal table in a system that produces a sharpness noise under heavy workload.

FIG. 6A shows a fan control method based on a thermal table in a system that produces a sharpness noise under heavy workload. Generally, a fan in conventional computing device is controlled based on a thermal table, or else is controlled by some group of dynamic thermal tuning (DTT) settings. For example, a fan may be activated, sped up, slowed down, or deactivated based on the temperature of a subcomponent in the device. In the case of a heavy workload being applied to the device at time $t_0$, the temperature of subcomponents (e.g., a CPU, a memory) may increase and require active cooling from a fan to stay within operational temperature limits (e.g., performance limits, damage limits). For example, after some time interval $\Delta t$ following the start of the heavy workload at time $t_0$, the temperature $T_s$ of a subcomponent in the device may exceed a predetermined threshold $T_{thresh}$ and trigger the activation of the fan. While the fan achieves sufficient speed to generate a broadband noise to eliminate the sharpness noise after time $t_0+\Delta t$, the user is subjected to the sharpness noise from the CPU (e.g., an unpleasant whine emitted from the device while the CPU initially executes the heavy workload) during period between time $t_0$ and time $t_0+\Delta t$.

Figure 6B:
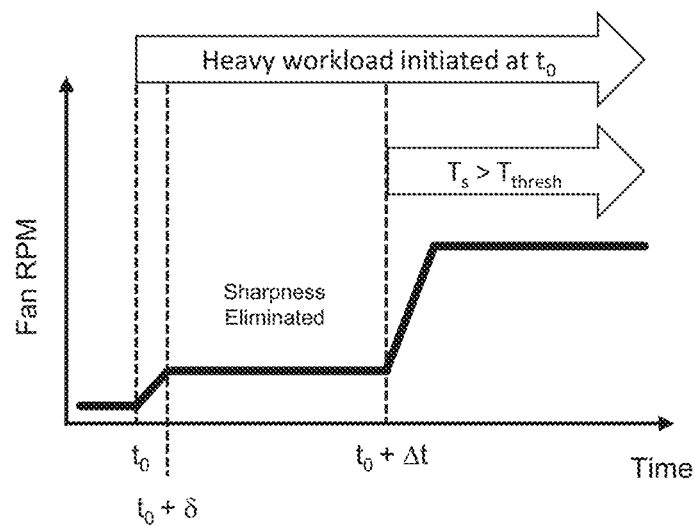
FIG. 6B shows a fan control based on the system power level in a system that eliminates a sharpness noise under heavy workload, in accordance with one or more embodiments of the invention.

FIG. 6B shows a fan control based on the system power level in a system that eliminates a sharpness noise under heavy workload, in accordance with one or more embodiments of the invention. Basing the fan control method on the system power level provides faster activation of the fan 30 and faster elimination of the sharpness noise generated by the CPU 12. At or after initiation of the heavy workload at time t0, the monitoring system 306 detects an elevated system power level (e.g., increased power consumption from the entire system to execute the heavy workload) and activates the fan 30 within the time interval δ. At time $t_0+\delta$, the fan 30 achieves a non-zero speed (i.e., revolutions per minute (RPM)>0) to generate a broadband noise to complement the narrowband noise from CPU 12 and eliminate the sharpness noise, as describe above with respect to FIG. 5B.

In one or more embodiments, activation of the fan 30 may be nearly instantaneous after start of the heavy workload and the time interval S is the time required to bring the fan 30 up to speed. In other words, in contrast with waiting for the fan 30 to activate based on elevated temperatures in a subcomponent, the fan control method based on the system power level provides faster activation of the fan 30 and faster elimination of the sharpness noise.

In one or more embodiments, the fan 30 may be activated with the lowest possible speed setting of the fan 30 and generates an overall fan noise that is less than 20 dB or less than 17 dB across the entire spectrum of the fan noise. The overall fan noise may be imperceptible to human perception while still providing the necessary broadband frequency contributions to affect the perceived sharpness of the overall system noise. In one or more embodiments, the fan 30 generates a broadband noise with a bandwidth that includes a frequency of 5 kHz.

Figure 7A:
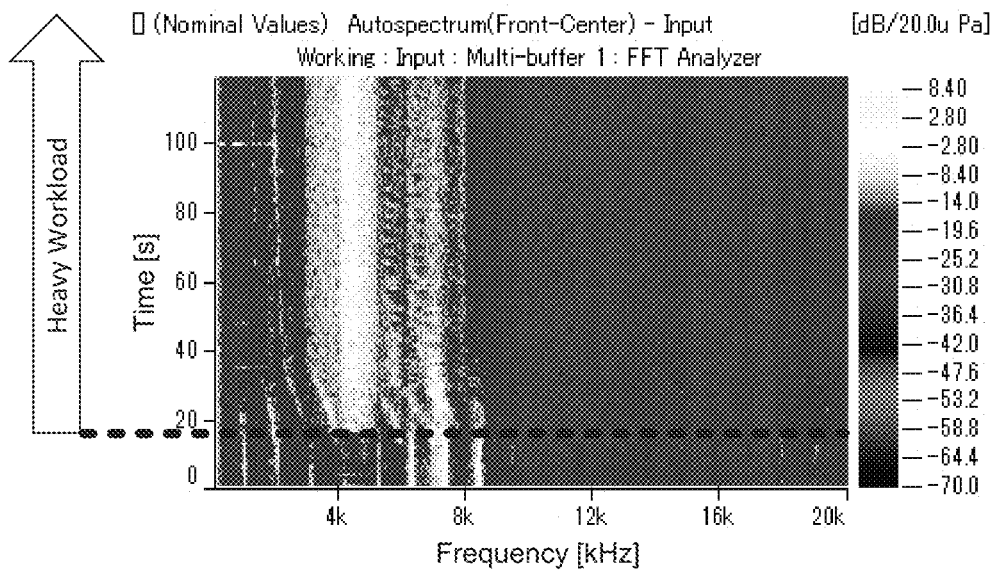
FIG. 7A shows a measured time-varying spectrograph of a system producing a sharpness noise.

FIG. 7A shows a measured time-varying spectrograph of a system producing a sharpness noise. In the measured spectrograph, the onset of the sharpness noise due to the heavy workload can be seen by the change in spectral composition near time t=18 sec. The sharpness noise of the test article has been determined to be primarily cause be the narrowband feature centered near 5 kHz (bright central band surrounded by lower intensity streaks at high and lower frequencies).

Figure 7B:
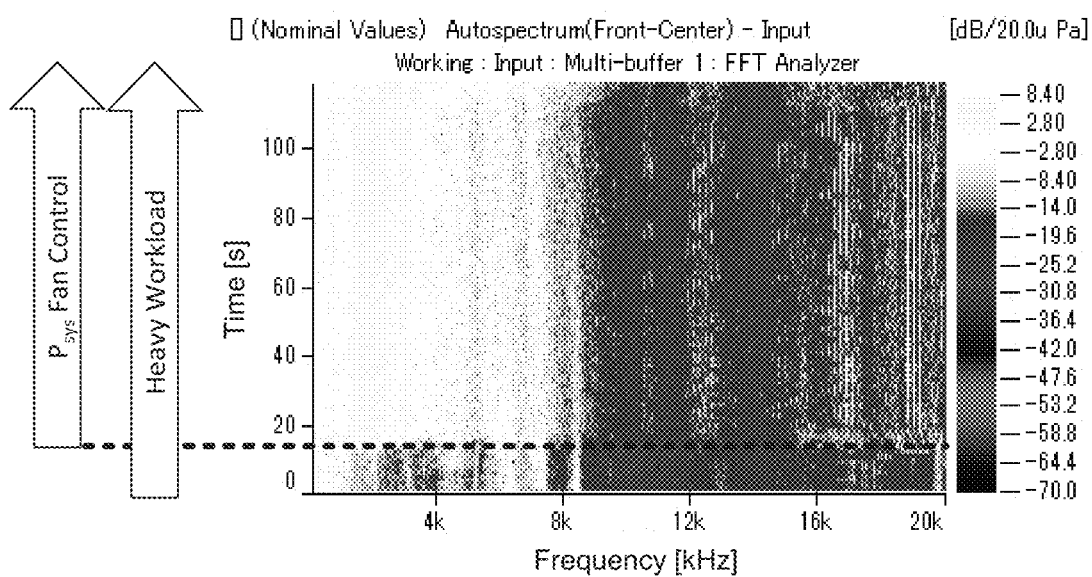
FIG. 7B shows a measured time-varying spectrograph of a system eliminating a sharpness noise in accordance with one or more embodiments of the invention.

FIG. 7B shows a measured time-varying spectrograph of a system eliminating a sharpness noise in accordance with one or more embodiments of the invention. To eliminate or reduce the sharpness noise, a fan 30 in the test article was started at approximate time t=15 sec in FIG. 7B to introduce a broadband noise that overlaps the narrowband noise generated by the CPU 12 in the test article. The broadband noise is centered near 4 kHz as shown by the frequency band spanning 0 kHz to 8 kHz starting at time t=15 sec. The change in the relative distribution of frequency components produces a lower sharpness value and improved the user experience of the test article.

Figure 8A:
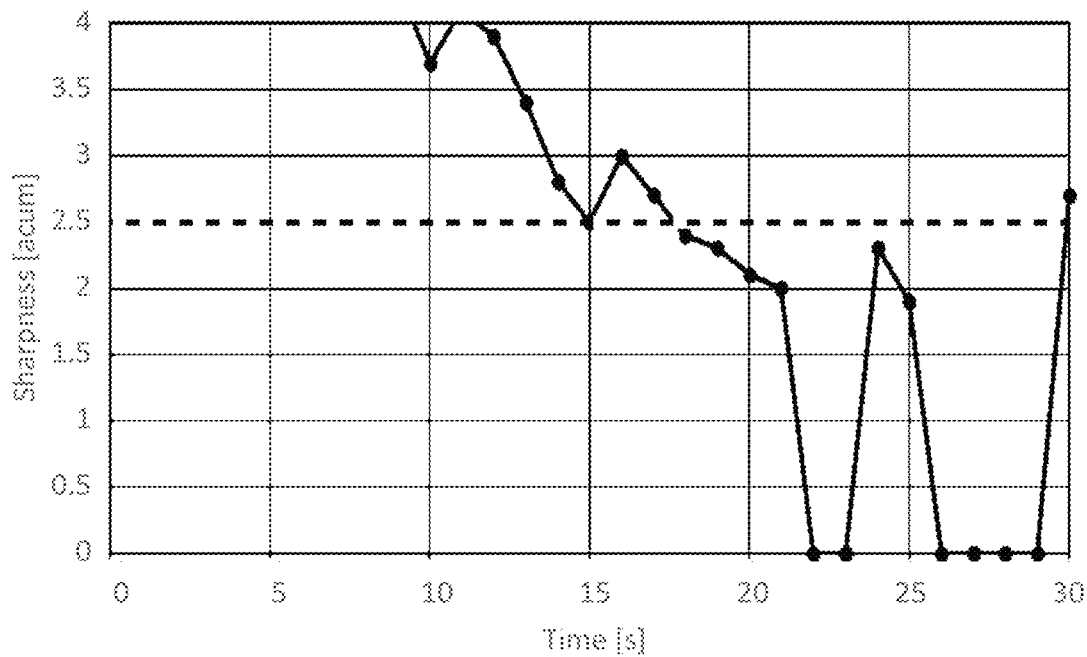
FIG. 8A shows a time-varying sharpness measurement of a system using fan control based on a thermal table.

FIG. 8A shows a time-varying sharpness measurement of a system using fan control based on a thermal table. During the time period between t=0 sec and t=17 sec, the system produces a sharpness noise that exceeds a predetermined threshold of 2.5 acum. Based on the thermal table control scheme, a fan is eventually activated to aid in cooling the system. Eventually, by time t=17 sec, the broadband noise contribution from the fan lowers the measured sharpness level to below the predetermined threshold of 2.5 acum. Because the fan may be deactivated after successfully cooling a subcomponent (satisfy the conditions of the thermal table), it is possible for the sharpness noise to return and exceed the predetermined threshold.

Figure 8B:
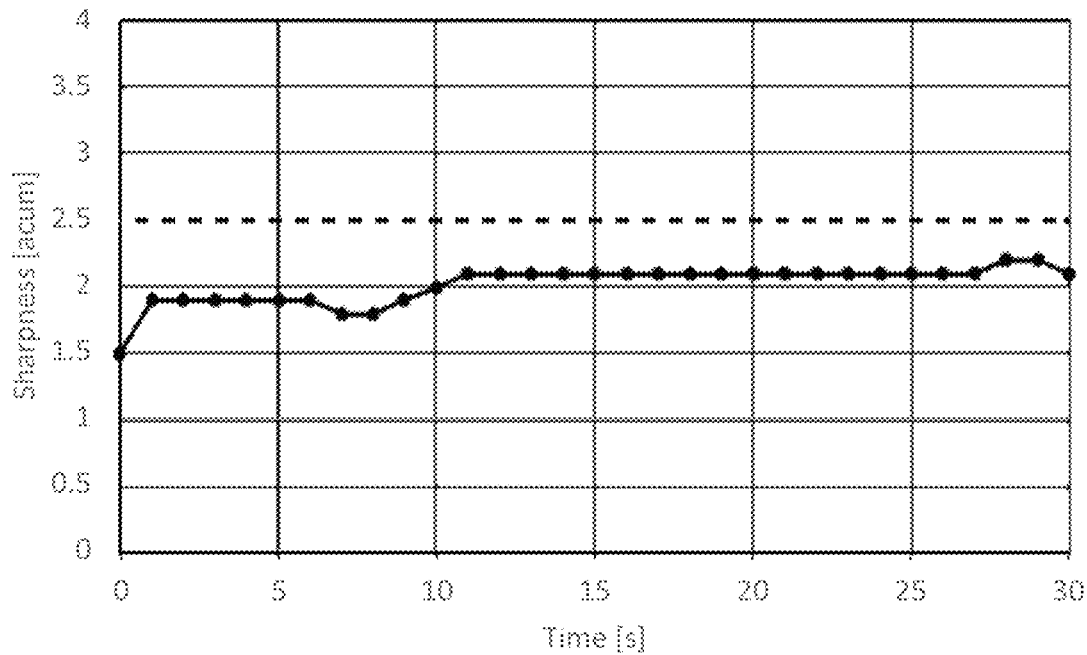
FIG. 8B shows a time-varying sharpness measurement of a system using fan control based on the system power level to eliminating a sharpness noise, in accordance with one or more embodiments of the invention.

FIG. 8B shows a time-varying sharpness measurement of a system using fan control based on the system power level to eliminating a sharpness noise, in accordance with one or more embodiments of the invention. By measuring an increase in a system power level associated with the heavy workload, a fan 30 may be immediately activated and maintained at a sufficient fan speed to provide a broadband noise. In other words, regardless of a need for active cooling to maintain the operational temperature limits of subcomponents of the computing system 100, the fan 30 is active and maintained at a non-zero speed. As shown in FIG. 8B, the test article controlled according to one or more embodiments of the invention produces a sharpness noise that remains below the predetermined threshold of 2.5 acum during the entire duration of test. In one or more embodiments, the predetermined sharpness threshold may be any appropriate value to provide a comfortable user experience.

Figure 9:
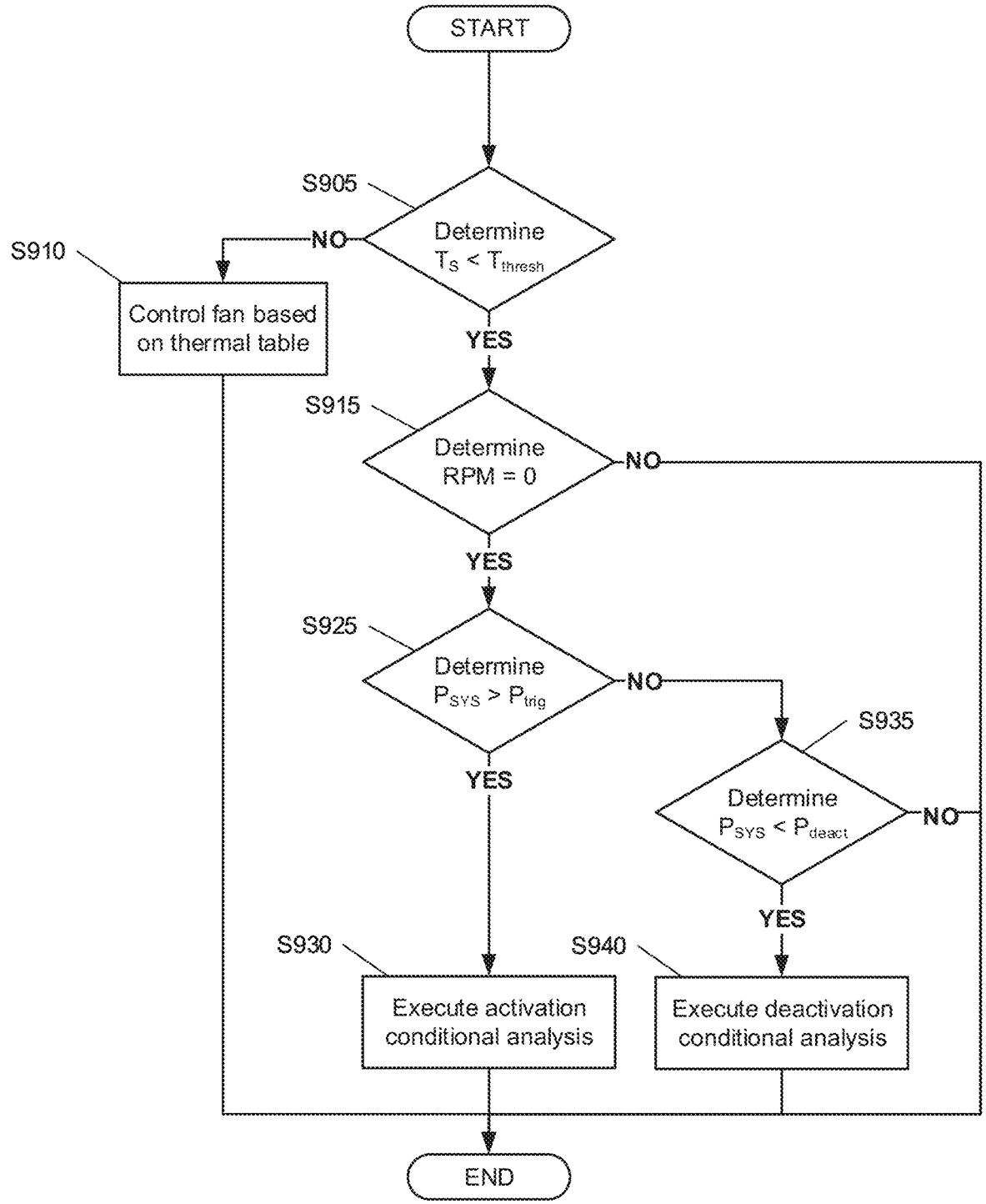
FIG. 9 shows a flowchart in accordance with one or more embodiments of the invention.

FIG. 9 shows a flowchart in accordance with one or more embodiments of the invention. One or more of the individual processes shown in FIG. 9 may be omitted, repeated, and/or performed in a different order than the order shown in FIG. 9. For example, the "END" of process shown in FIG. 9 may connect direct to the "START" to execute the process in a continuous loop while the computing system 100 is powered. Accordingly, the scope of the invention should not be limited by the specific arrangement as depicted in FIG. 9.

At S905, a temperature $T_s$ of a subcomponent in the computing system 100 is measured by the monitoring system 306 to determine whether the temperature $T_s$ is less than a threshold temperature $T_{thresh}$. In one or more embodiments, the subcomponent may be the CPU 12 that produces the sharpness noise or a memory 14 (e.g., one or more dual in-line memory modules (DIMM)) of the computing system 100. The temperature threshold $T_{thresh}$ may be a parameter selected based on a thermal table stored in the buffer 302. For example, the temperature threshold $T_{thresh}$ may be a value of 41° C. when the measured subcomponent is a DIMM or may be a value of 46° C. when the measured subcomponent is the CPU 12. In other words, S905 is a thermal decision that allows the system to activate the fan 30 based on the default thermal table to ensure active cooling is provided when operational temperatures are high.

If the determination at S905 is NO ($T_s \geq T_{thresh}$), the fan control process continues on to S910, described below.

If the determination at S905 is YES ($T_s < T_{thresh}$), the fan control process proceeds to S915, described below.

At S910, when the temperature $T_s$ is greater than or equal to $T_{thresh}$, the computing system 100 defaults to fan control based on a thermal table (i.e., a predetermined table of fan level settings). Accordingly, the temperature levels of the computing system 100 may be appropriately managed to avoid damaging the system. After fan control is executed based on the thermal table, the fan control process ends or may restart by returning to the measurement of the temperature $T_s$ at S905.

At S915, a fan speed RPM of the fan 30 is measured by the monitoring system 306 and/or cooling system 308 to determine whether the fan speed RPM is equal to zero. In other words, S915 is a determination of whether any potential sharpness noise is already being eliminated or reduced by an activated fan 30. In one or more embodiments, another sensor (e.g., audio, vibration) or manual user input may be used to determine whether a sharpness noise is present or not.

If the determination at S915 is NO (RPM 0), the fan 30 is already active and producing a broadband noise that eliminates or reduces any potential sharpness noise. Accordingly when the determination at S915 is NO, the fan control process ends or may restart by returning to the measurement of the temperature $T_s$ at S905.

If the determination at S915 is YES (RPM≠0), the fan 30 is not active and the fan control process proceeds based on a first power determination at S925, described below.

At S925, a system power level $P_{SYS}$ is measured by the monitoring system 306 and/or power system 304 to determine whether the system power level $P_{SYS}$ is greater than a trigger threshold $P_{trig}$. In one or more embodiments, the system power level $P_{SYS}$ may be measured by sensors integrated in the power control circuit 24, the battery 40, and/or an external power supply of the computing system 100. In other words, S925 is a first power determination regarding whether the computing system 100 is under a heavy enough workload to produce the sharpness noise. In one or more embodiments, the trigger threshold $P_{trig}$ may be 25 W or 50 W. The threshold value may depend on the type and/or quantity of subcomponents installed in the computing system 100 (e.g., different PC models).

If the determination at S925 is NO ($P_{SYS} \leq P_{trig}$), the CPU 12 is not under a heavy enough workload to generate sharpness noise and the fan control process proceeds to a second power determination at S935, described below.

If the determination at S925 is YES ($P_{SYS} \geq P_{trig}$), the CPU 12 is under a heavy enough workload to generate the sharpness noise and the fan control process proceeds to S930, described below.

At S930, the monitoring system 306 and/or cooling system 308 activate the fan 30 to produce the broadband noise that eliminates or reduces the sharpness noise from CPU 12. The activation of fan 30 may be based on an activation conditional analysis described in further detail below with respect to FIG. 10. In one or more embodiments, the fan 30 may be activated to a predetermined setting (e.g., the lowest possible speed setting of the fan 30). In one or more embodiments, the predetermined setting generates less than 20 dB or less than 17 dB of noise from the fan 30 and may be negligible or imperceptible to human hearing. After activation of the fan 30, the fan control process ends or may restart by returning to the measurement of the temperature $T_s$ at S905.

At S935, the monitoring system 306 and/or power system 304 determine whether the system power level $P_{SYS}$ is less than a deactivation threshold $P_{deact}$. In other words, S935 is a second power determination regarding whether the computing system 100 is under a light enough workload (i.e., no sharpness noise) to deactivate the fan 30. In one or more embodiments, the deactivation threshold $P_{deact}$ may be 15 W. The threshold value may depend on the type and/or quantity of subcomponents installed in the computing system 100 (e.g., different PC models).

If the determination at S935 is NO ($P_{SYS} \geq P_{deact}$ and $P_{SYS} \leq P_{trig}$), the CPU 12 is under a heavy enough workload to maintain the current settings of fan 30. Specifically, hysteresis may apply to the workload levels and/or the system power level $P_{SYS}$ required to generate the sharpness noise. In other words, the system power level $P_{SYS}$ may need to drop to a value lower that the trigger threshold $P_{trig}$ to stop producing the sharpness noise. Therefore, when $P_{SYS} \geq P_{deact}$, the fan control process ends or may restart by returning to the measurement of the temperature $T_s$ at S905.

If the determination at S935 is YES ($P_{SYS} < P_{deact}$), the CPU 12 is under a low enough workload that the sharpness noise is no longer produced and the fan control process proceeds to S940, described below.

At S940, the monitoring system 306 and/or cooling system 308 deactivate the fan 30 because elimination or reduction of sharpness noise from CPU 12 is no longer required. The deactivation of the fan 30 improves performance of the computing system 100 by utilizing less power. The deactivation of fan 30 may be based on a deactivation conditional analysis described in further detail below with respect to FIG. 11. In one or more embodiments, the fan 30 may be deactivated by idling or by actively setting the fan speed RPM equal to 0. Afterward, the fan control process ends or may restart by returning to the measurement of the temperature $T_s$ at S905.

Figure 10:
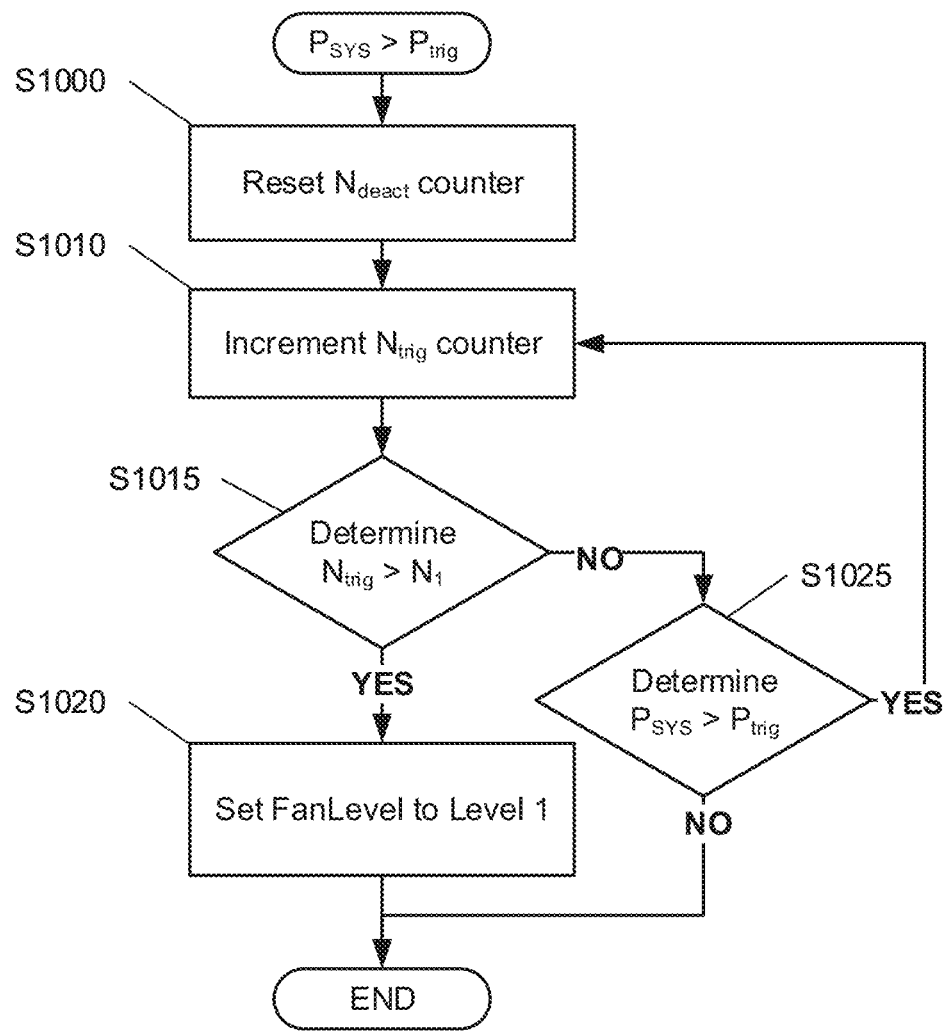
FIG. 10 shows a flowchart in accordance with one or more embodiments of the invention.
Figure 11:
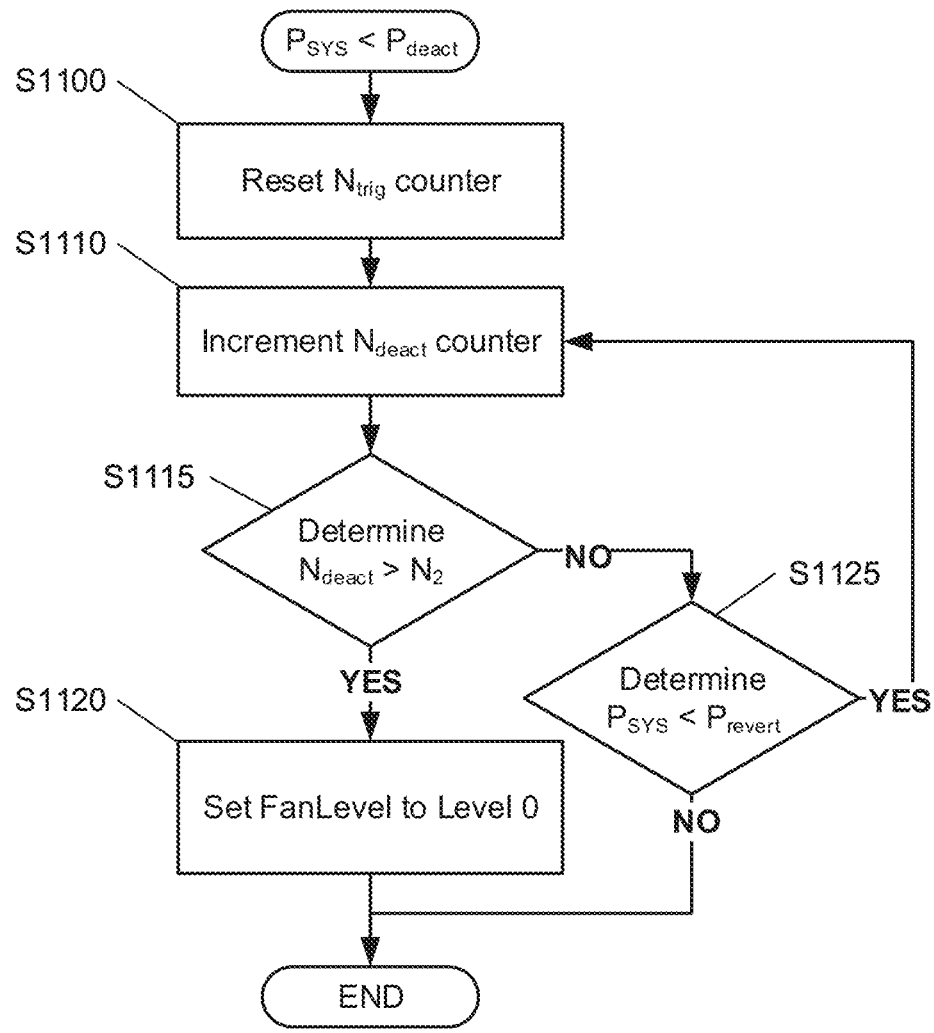
FIG. 11 shows a flowchart in accordance with one or more embodiments of the invention.

FIGS. 10 and 11 relate to methods of conditional analysis of the system power level $P_{SYS}$ based on a series of consecutive measurements. According, the monitoring system 306 and/or the buffer 302 may maintain a trigger counter $N_{trig}$ and a deactivation counter $N_{deact}$ for use during the conditional analysis. When preforming conditional analysis for activation (triggering) or deactivation of the fan 30, the complementary counter is reset to a value of zero, as described below.

FIG. 10 shows a flowchart in accordance with one or more embodiments of the invention. One or more of the individual processes shown in FIG. 10 may be omitted, repeated, and/or performed in a different order than the order shown in FIG. 10. Accordingly, the scope of the invention should not be limited by the specific arrangement as depicted in FIG. 10.

As discussed above, the activation of fan 30 at S930 may be based on an activation conditional analysis. In other words, the monitoring system 306 and/or power system 304 may perform a predetermined number of consecutive measurements of $P_{SYS}$ to confirm the conditions of the computing system 100 are appropriate for activating the fan 30.

At S1000, a deactivation counter $N_{deact}$ is initialized or reset to a value of zero.

At S1010, a trigger counter is incremented by one because the monitoring system 306 and/or power system 304 have determined $P_{SYS} > P_{trig}$ at S925.

At S1015, the monitoring system 306 determines whether the trigger counter $N_{trig}$ is greater than a first counter threshold $N_1$.

If the determination at S1015 is NO ($N_{trig} \leq N_1$), the monitoring system 306 has not recorded a sufficient number of consecutive measurements to determine that the system power level $P_{SYS}$ is reliably above the trigger threshold $P_{trig}$. In other words, the monitoring system 306 and/or power system 304 may perform a repeat measurement at S1025 described below.

If the determination at S1015 is YES ($N_{trig} > N_1$), the monitoring system 306 has recorded a sufficient number of consecutive measurements to determine that the system power level $P_{SYS}$ is reliably above the trigger threshold $P_{trig}$, and the activation conditional analysis proceeds to S1020 described below. In other words, when each of a predetermined number (e.g., first counter threshold $N_1$) of consecutive measurements are greater than the trigger threshold $P_{trig}$, the system power level $P_{SYS}$ is determined to be reliably above the trigger threshold $P_{trig}$ and activation of the fan 30 is performed.

At S1020, the monitoring system 306 and/or the cooling system 308 set a FanLevel (e.g., a speed setting or a power setting) of the fan 30 to Level 1 (i.e., the lowest possible setting of the fan 30). After activation of the fan 30, the activation conditional analysis ends. The corresponding fan control process ends or may restart by returning to the measurement of the temperature $T_s$ at S905.

At S1025, the system power level $P_{SYS}$ is remeasured by the monitoring system 306 and/or power system 304 to determine whether the system power level $P_{SYS}$ is still greater than the trigger threshold $P_{trig}$.

If the determination at S1025 is NO ($P_{SYS} \leq P_{trig}$), the CPU 12 is not under a heavy enough workload to generate sharpness noise and the activation conditional analysis ends. The corresponding fan control process ends and may restart by returning to the measurement of the temperature $T_s$ at S905.

If the determination at S1025 is YES ($P_{SYS} > P_{trig}$), the CPU 12 is still under a heavy workload that produces the sharpness noise and the activation conditional analysis returns to S1010 to increment the trigger counter $N_{trig}$ and continue repeating measurements until the predetermined number of consecutive measurements above the threshold is completed.

FIG. 11 shows a flowchart in accordance with one or more embodiments of the invention. One or more of the individual processes shown in FIG. 11 may be omitted, repeated, and/or performed in a different order than the order shown in FIG. 11. Accordingly, the scope of the invention should not be limited by the specific arrangement as depicted in FIG. 11.

As discussed above, the deactivation of fan 30 at S940 may be based on a deactivation conditional analysis. In other words, the monitoring system 306 and/or power system 304 may perform a predetermined number of consecutive measurements of $P_{SYS}$ to confirm the conditions of the computing system 100 are appropriate for deactivating the fan 30.

At S1100, an activation counter $N_{trig}$ is initialized or reset to a value of zero.

At S1110, a deactivation counter is incremented by one because the monitoring system 306 and/or power system 304 have determined $P_{SYS} < P_{deact}$ at S935.

At S1115, the monitoring system 306 determines whether the deactivation counter $N_{deact}$ is greater than a second counter threshold $N_2$.

If the determination at S1115 is NO ($N_{deact} \leq N_2$), the monitoring system 306 has not recorded a sufficient number of consecutive measurements to determine that the system power level $P_{SYS}$ is reliably below the deactivation threshold $P_{deact}$. In other words, the monitoring system 306 and/or power system 304 may perform a repeat measurement at S1125 described below.

If the determination at S1115 is YES ($N_{deact} > N_2$), the monitoring system 306 has recorded a sufficient number of consecutive measurements to determine that the system power level $P_{SYS}$ is reliably below the deactivation threshold $P_{deact}$, and the deactivation conditional analysis proceeds to S1120 described below. In other words, when each of a predetermined number (e.g., second counter threshold $N_2$) of consecutive measurements are less than the deactivation threshold $P_{deact}$, the system power level $P_{SYS}$ is determined to be reliably below the deactivation threshold $P_{deact}$ and deactivation of the fan 30 is performed.

At S1120, the monitoring system 306 and/or the cooling system 308 set a FanLevel of the fan 30 to Level 0 (i.e., deactivation of the fan 30 by idling or actively setting the fan speed to 0). After deactivation of the fan 30, the deactivation conditional analysis ends. The corresponding fan control process ends or may restart by returning to the measurement of the temperature $T_s$ at S905.

At S1125, the system power level $P_{SYS}$ is remeasured by the monitoring system 306 and/or power system 304 to determine whether the system power level $P_{SYS}$ is still less than the deactivation threshold $P_{deact}$.

If the determination at S1125 is NO ($P_{SYS} \geq P_{deact}$), the CPU 12 is under a heavy enough workload to generate sharpness noise and the deactivation conditional analysis ends. The corresponding fan control process also ends and may restart by returning to the measurement of the temperature $T_s$ at S905.

If the determination at S1125 is YES ($P_{SYS} < P_{deact}$), the CPU 12 is still not under a heavy workload to produce the sharpness noise and the deactivation conditional analysis returns to S1110 to increment the deactivation counter $N_{deact}$ and continue repeating measurements until the predetermined number of consecutive measurements below the threshold is completed.

In one or more embodiments, the first and second counter thresholds $N_1$, $N_2$ have a value of 3. However, the first and second counter thresholds may have different values and may be set to any appropriate positive integer value to justify a reliable determination of the system power level $P_{SYS}$.

Embodiments of the invention may be implemented on virtually any type of computing system 100, regardless of the platform being used. For example, the computing system 100 may be one or more mobile devices (e.g., laptop computer, smart phone, personal digital assistant, tablet computer, or other mobile device), desktop computers, servers, blades in a server chassis, or any other type of computing device or devices that includes at least the minimum processing power, memory, and input and output device(s) to perform one or more embodiments of the invention. For example, the computing system 100 may include one or more computer processor(s), associated memory (e.g., random access memory (RAM), cache memory, flash memory), one or more storage device(s) (e.g., a hard disk, a solid state drive, an optical drive such as a compact disk (CD) drive or digital versatile disk (DVD) drive, a flash memory stick), and numerous other elements and functionalities. The computer processor(s) may be an integrated circuit for processing instructions. For example, the computer processor(s) may be one or more cores, or micro-cores of a processor. The computing system 100 may also include one or more input device(s), such as a camera, imager, touchscreen, keyboard, mouse, microphone, touchpad, electronic pen, or any other type of input device. Further, the computing system 100 may include one or more output device(s), such as a projector, screen (e.g., a liquid crystal display (LCD), a plasma display, touchscreen, cathode ray tube (CRT) monitor, or other display device), an external storage, or any other output device. One or more of the output device(s) may be the same or different from the input device(s). The computing system 100 may be connected to a network (e.g., a local area network (LAN), a wide area network (WAN) such as the Internet, mobile network, or any other type of network) via a network interface connection (not shown). The input and output device(s) may be locally or remotely (e.g., via the network) connected to the computer processor(s), memory, and storage device(s). Many different types of computing systems exist, and the aforementioned input and output device(s) may take other forms.

Software instructions in the form of computer readable program code to perform embodiments of the invention may be stored, in whole or in part, temporarily or permanently, on a non-transitory computer readable medium such as a CD, DVD, storage device, a diskette, a tape, flash memory, physical memory, or any other computer readable storage medium. Specifically, the software instructions may correspond to computer readable program code that when executed by a processor(s), is configured to perform embodiments of the invention.

One or more of the embodiments of the invention may have one or more of the following improvements to computing systems: eliminating or reducing a sharpness noise by generating an imperceptible fan noise; eliminating or reducing a sharpness noise using fan control that is more responsive (faster to activate/deactivate) than temperature based control. These advantages further demonstrate a practical application by improving power usage of a fan while improving a user experience of the computing system.

Although the disclosure has been described with respect to a limited number of embodiments, those skilled in the art, having benefit of this disclosure, will appreciate that various other embodiments may be devised without departing from the scope of the present invention. Accordingly, the scope of the invention should be limited only by the attached claims.

What is claimed is:

1. A method of operating a fan of a computing system, the method comprising:
   measuring a temperature of a subcomponent of the computing system;
   comparing the temperature to a temperature threshold;
   when the temperature is greater than or equal to the temperature threshold, controlling the fan based on a predetermined table of fan level settings;
   when the temperature less than the temperature threshold, measuring a fan speed of the fan;
   when the fan speed is not equal to zero, returning to the measurement of the temperature; and
   when the fan speed is equal to zero, controlling the fan based on a first power determination, wherein
   the first power determination includes:
      measuring a system power level;
      comparing the system power level to a trigger threshold;
      when the system power level is greater than the trigger threshold, activating the fan to a predetermined setting; and
      when the system power level is less than or equal to the trigger threshold, controlling the fan based on a second power determination,
   the measuring of the system power level includes a predetermined number of consecutive measurements, and
   in the comparison of the system power level to the trigger threshold:
      when each of the predetermined number of consecutive measurements are greater than the trigger threshold, the system power level is determined to be greater than the trigger threshold; and
      when each of the predetermined number of consecutive measurements are not greater than the trigger threshold, the method returns to the measurement of the temperature.

2. The method of claim 1, wherein
   the subcomponent of the computing system is a central processing unit.

3. The method of claim 1, wherein
   the subcomponent of the computing system is a storage device.

4. The method of claim 1, wherein
   the predetermined setting of the fan is a lowest possible speed setting of the fan.

5. The method of claim 4, wherein
   the lowest possible speed setting of the fan generates a noise that is less than 20 dB, and
   a bandwidth of the noise generated by the fan includes a frequency of 5 kHz.

6. A method of operating a fan of a computing system, the method comprising:
   measuring a temperature of a subcomponent of the computing system;
   comparing the temperature to a temperature threshold;
   when the temperature is greater than or equal to the temperature threshold, controlling the fan based on a predetermined table of fan level settings;
   when the temperature less than the temperature threshold, measuring a fan speed of the fan;
   when the fan speed is not equal to zero, returning to the measurement of the temperature; and
   when the fan speed is equal to zero, controlling the fan based on a first power determination, wherein
   the first power determination includes:
      measuring a system power level;
      comparing the system power level to a trigger threshold;
      when the system power level is greater than the trigger threshold, activating the fan to a predetermined setting; and
      when the system power level is less than or equal to the trigger threshold, controlling the fan based on a second power determination, and
   the second power determination includes:
      comparing the system power level to a deactivation threshold;
      when the system power level is less than the deactivation threshold, deactivating the fan; and
      when the system power level is greater than or equal to the deactivation threshold, returning to the measurement of the temperature.

7. The method of claim 6, wherein
   the measuring of the system power level includes a predetermined number of consecutive measurements, and
   in the comparison of the system power level to the deactivation threshold:
      when each of the predetermined number of consecutive measurements are less than the deactivation threshold, the system power level is determined to be less than the deactivation threshold; and
      when each of the predetermined number of consecutive measurements are not less than the deactivation threshold, the method returns to the measurement of the temperature.

8. A computer system comprising:
   a power supply;
   a processor coupled to the power supply; and
   a fan, wherein
   the processor is configured to:
      measure a temperature of a subcomponent of the computing system;
      compare the temperature to a temperature threshold;
      when the temperature is greater than the temperature threshold, control the fan based on a predetermined table of fan level settings;
      when the temperature less than or equal to the temperature threshold, measure a fan speed of the fan;
      when the fan speed is not equal to zero, return to the measurement of the temperature; and
      when the fan speed is equal to zero, control the fan based on a first power determination, wherein
   for the first power determination, the processor is configured to:
      measure a system power level based on the power supply;
      compare the system power level to a trigger threshold;

when the system power level is greater than the trigger threshold, activate the fan to a predetermined setting; and when the system power level is less than or equal to the trigger threshold, control the fan based on a second power determination, and the measuring of the system power level includes a predetermined number of consecutive measurements, and in the comparison of the system power level to the trigger threshold:

when each of the predetermined number of consecutive measurements are greater than the trigger threshold, the system power level is determined to be greater than the trigger threshold; and when each of the predetermined number of consecutive measurements are not greater than the trigger threshold, the processor is configured to return to the measuring of the temperature.

* * * * *